United States Patent
Mueller-Meskamp et al.

(10) Patent No.: US 11,398,555 B2
(45) Date of Patent: Jul. 26, 2022

(54) TRANSISTOR DEVICE WITH A PLURALITY OF ACTIVE GATES THAT CAN BE INDIVIDUALLY MODULATED TO CHANGE PERFORMANCE CHARACTERISTICS OF THE TRANSISTOR

(71) Applicant: GLOBALFOUNDRIES U.S. Inc., Santa Clara, CA (US)

(72) Inventors: Lars Mueller-Meskamp, Dresden (DE); Luca Pirro, Dresden (DE)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 267 days.

(21) Appl. No.: 16/535,338

(22) Filed: Aug. 8, 2019

(65) Prior Publication Data
US 2021/0043733 A1   Feb. 11, 2021

(51) Int. Cl.
*H01L 29/10*   (2006.01)
*H01L 29/423*  (2006.01)
*H01L 27/12*   (2006.01)

(52) U.S. Cl.
CPC ...... *H01L 29/1087* (2013.01); *H01L 27/1203* (2013.01); *H01L 29/42356* (2013.01)

(58) Field of Classification Search
CPC ............. H01L 29/1087; H01L 27/1203; H01L 29/42356
See application file for complete search history.

(56) References Cited

U.S. PATENT DOCUMENTS

| | | | |
|---|---|---|---|
| 8,008,649 B2 | 8/2011 | Register, II et al. | |
| 8,329,564 B2 | 12/2012 | Cai et al. | |
| 9,178,070 B2 * | 11/2015 | Zhu | H01L 29/66772 |
| 9,190,485 B2 | 11/2015 | Asenov | |
| 9,337,302 B2 * | 5/2016 | Fenouillet-Beranger | H01L 27/0296 |
| 2014/0017856 A1 * | 1/2014 | Fenouillet-Beranger | H01L 27/1207 438/151 |

OTHER PUBLICATIONS

Dirani et al., "A Sharp-Switching Gateless Device (Z3-FET) in Advanced FDSOI Technology," EUROSOI-ULIS 2016, pp. 131-134, 978-1-4673-8609-8/16, 2016 IEEE.
(Continued)

*Primary Examiner* — Latanya N Crawford Eason
(74) *Attorney, Agent, or Firm* — Anthony Canale; Hoffman Warnick LLC

(57) ABSTRACT

One illustrative device disclosed herein includes a gate structure positioned above an active semiconductor layer of an SOI substrate and a counter-doped back-gate region positioned in the doped base semiconductor substrate of the SOI substrate. In this particular embodiment, the device also includes a counter-doped back-gate contact region positioned in the base semiconductor substrate, wherein the counter-doped back-gate region and the counter-doped back-gate contact region are doped with a dopant type that is opposite the dopant type in the base semiconductor substrate. In this illustrative example, the counter-doped back-gate region and the counter-doped back-gate contact region are laterally separated from one another by a portion of the doped base semiconductor substrate. The device also includes a conductive back-gate contact structure that is conductively coupled to the counter-doped back-gate contact region.

20 Claims, 8 Drawing Sheets

(56) References Cited

OTHER PUBLICATIONS

Solaro et al., "Innovated ESD Protections for UTBB FD-SOI Technology," IEDM13-180-183, 978-1-4799-2306-9/13, 2013 IEEE.
Wan et al., "Z2-FET Used as 1-Transistor High-Speed DRAM," pp. 197-200, 978-1-4673-1708-5/12, 2012 IEEE.

\* cited by examiner

US 11,398,555 B2

TRANSISTOR DEVICE WITH A PLURALITY OF ACTIVE GATES THAT CAN BE INDIVIDUALLY MODULATED TO CHANGE PERFORMANCE CHARACTERISTICS OF THE TRANSISTOR

BACKGROUND

Field of the Disclosure

Generally, the present disclosure relates to various illustrative embodiments of a novel integrated circuit (IC) product that may include various embodiments of various transistor devices wherein the transistor includes a plurality of active gates that can be individually modulated to change the performance characteristics of the transistor device.

Description of the Related Art

In modern integrated circuit products, such as microprocessors, storage devices, ASICs and the like, a very large number of circuit elements, especially transistors, are provided on a restricted chip area. The transistors come in a variety of shapes and forms, e.g., planar transistors, FinFET transistors, nanowire devices, etc. The transistors are typically either NFET or PFET type devices wherein the "N" and "P" designation is based upon the type of dopants used to create the source/drain regions of the devices. CMOS circuits include both NFET and PFET transistors.

As performance requirements have increased, the transistors may be formed in and above an SOI (semiconductor-on-insulator) substrate that includes a base semiconductor substrate, a buried insulation layer (sometime referred to as a "BOX" layer when the buried insulation layer comprises silicon dioxide) positioned on the base substrate and an active layer comprised of a semiconducting material positioned on the buried insulation layer. Moreover, such transistors may be formed as fully-depleted (FDSOI) devices wherein the active layer of the SOI substrate, i.e., the channel region of the transistors, is substantially free of free carriers, or as partially-depleted (PDSOI) devices, wherein there is a limited amount of doping in the active layer of the SOI substrate.

Body-biasing (or back-biasing) is a technique employed in FDSOI and PDSOI technologies to change certain performance characteristics of the transistor, such as its threshold voltage, leakage current characteristics, etc. Such body-biasing changes the electrostatic control of the transistors and shifts the threshold voltage ($V_{TH}$) of the device to either obtain more drive current (and, hence, higher performance) at the expense of increased leakage current when a forward back-bias is applied to the device or reduce the leakage current at the expense of reduced performance when a reverse back-bias is applied to the device.

Back-biasing may be applied in a dynamic manner, particularly on a block-by-block basis. That is, dynamic back-biasing can boost the performance of the device or IC product during limited periods of time when maximum peak performance is required. Dynamic back-biasing can also be employed to reduce current leakage and power consumption during the periods of time where peak performance is not mandated.

The present disclosure is directed to various illustrative embodiments of a novel integrated circuit (IC) product that may include various embodiments of various transistor devices wherein the transistor includes a plurality of active gates that can be individually modulated to change the performance characteristics of the transistor device.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

The present disclosure is generally directed to various illustrative embodiments of a novel integrated circuit (IC) product that may include various embodiments of various transistor devices wherein the transistor includes a plurality of active gates that can be individually modulated to change the performance characteristics of the transistor device. One illustrative device disclosed herein includes a gate structure positioned above an active semiconductor layer of an SOI substrate and a counter-doped back-gate region positioned in the doped base semiconductor substrate of the SOI substrate. In this particular embodiment, the device also includes a counter-doped back-gate contact region positioned in the base semiconductor substrate, wherein the counter-doped back-gate region and the counter-doped back-gate contact region are doped with a dopant type that is opposite the dopant type in the base semiconductor substrate. In this illustrative example, the counter-doped back-gate region and the counter-doped back-gate contact region are laterally separated from one another by a portion of the doped base semiconductor substrate. The device also includes a conductive back-gate contact structure that is conductively coupled to the counter-doped back-gate contact region.

Yet another illustrative device disclosed herein includes a gate structure positioned above an active semiconductor layer of an SOI substrate, a source region, a drain region and a counter-doped back-gate contact region positioned in the base semiconductor substrate of the SOI substrate, wherein the counter-doped back-gate region is doped with dopant type that is opposite the dopant type in the base semiconductor substrate. In this example, the counter-doped back-gate contact region is positioned at least partially vertically below the conductive gate electrode of the gate structure and the device further includes a conductive back-gate contact structure that is conductively coupled to the counter-doped back-gate contact region.

BRIEF DESCRIPTION OF THE DRAWINGS

The disclosure may be understood by reference to the following description taken in conjunction with the accompanying drawings, in which like reference numerals identify like elements, and in which.

DETAILED DESCRIPTION

Figure 1:
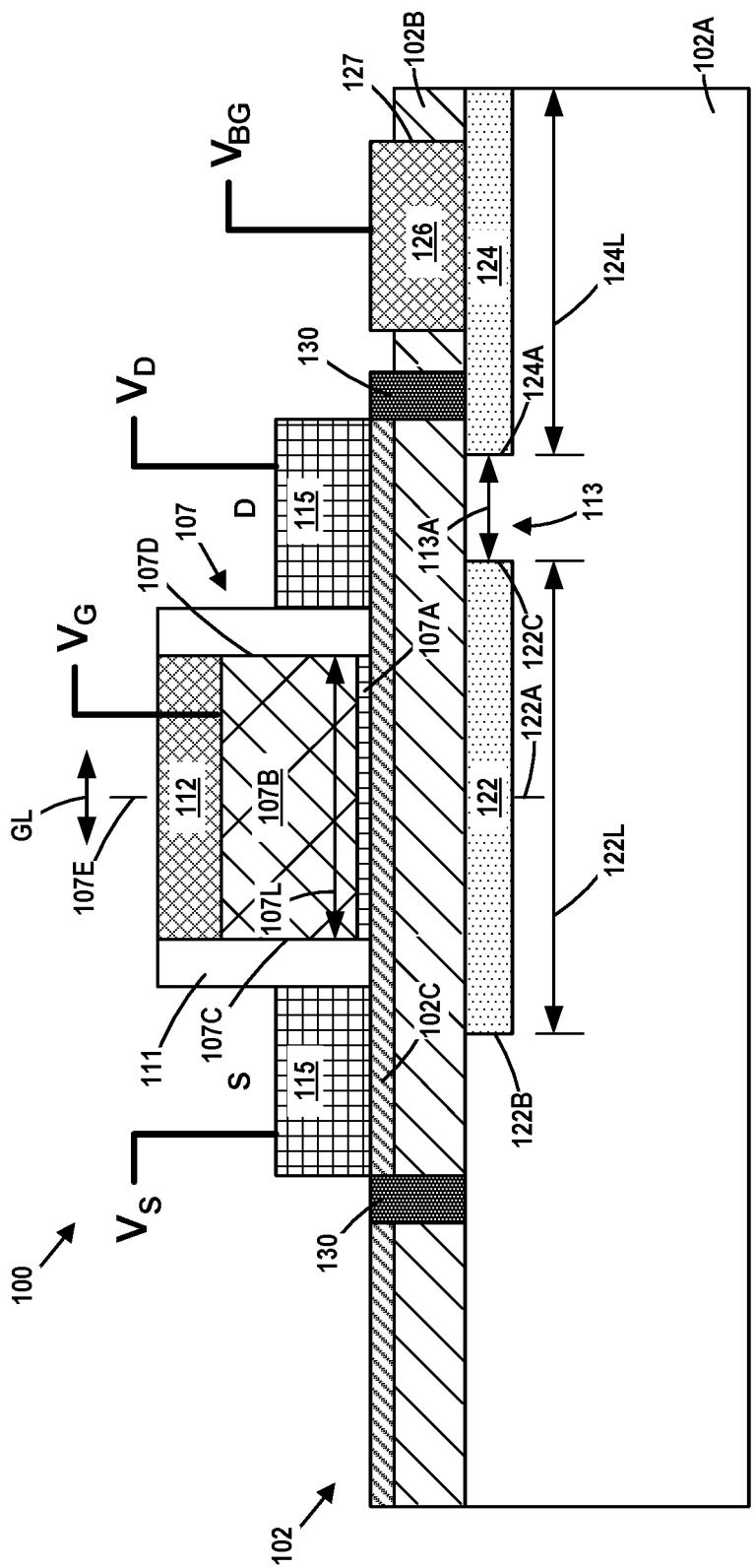
FIGS. 1-2 depict a novel integrated circuit (IC) product that includes one illustrative embodiment of a transistor device disclosed herein wherein the transistor comprises a plurality of active gates that can be individually modulated to change the performance characteristics of the transistor device, such as, for example, the threshold voltage of the transistor.

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the methods disclosed herein may be employed in manufacturing a variety of different devices, including, but not limited to, logic devices, memory devices, etc. As will also be appreciated by those skilled in the art after a complete reading of the present application, various doped regions, e.g., source/drain regions, halo implant regions and the like, are not depicted in the attached drawings. The drawings are not to scale. Of course, the inventions disclosed herein should not be considered to be limited to the illustrative examples depicted and described herein. The various components and structures of the devices and integrated circuit products disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2:
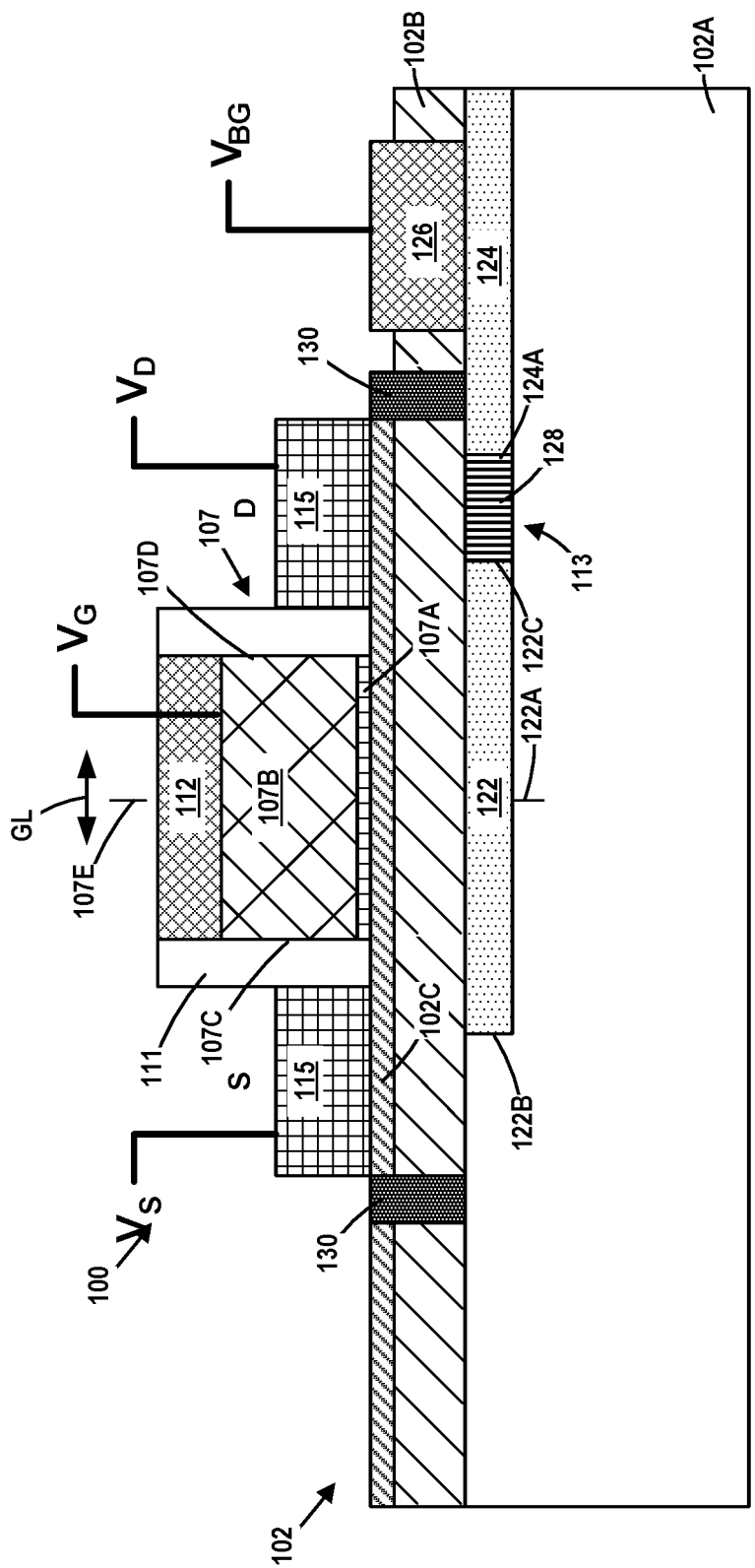

FIGS. 1-2 depict a novel integrated circuit (IC) product that includes one illustrative embodiment of a transistor device 100 disclosed herein wherein the transistor 100 comprises a plurality of active gates that can be individually modulated to change performance characteristics of the transistor device 100. In the specific examples depicted herein, the transistor comprises two such active gates—a front-gate and a back-gate—that permit or enable modulating the performance characteristics of the transistor device 100, such as, for example, the threshold voltage of the transistor 100. As will be appreciated by those skilled in the art after a complete reading of the present application, the transistor 100 may be either a P-type device or an N-type device. In the example depicted herein, the transistor 100 will be an illustrative planar transistor device. However, after a complete reading of the present application, those skilled in the art will appreciate that the subject matter disclosed herein may be applicable to other forms of transistor devices, e.g., 3D devices, etc.

In the depicted example, the transistor 100 will be formed on an illustrative SOI (semiconductor-on-insulator) structure or substrate 102. In general, the SOI structure 102 comprises a base semiconductor substrate 102A, a buried insulation layer 102B (sometime referred to as a "BOX" layer when the buried insulation layer comprises silicon dioxide) positioned on the base substrate 102A and an active semiconductor layer 102C positioned on the buried insulation layer 102B. Traditionally, and in one illustrative embodiment, the base semiconductor substrate 102A may comprise silicon, the buried insulation layer 102B may comprise silicon dioxide and the active semiconductor layer 102C may comprise silicon. Of course, the base semiconductor substrate 102A and the active semiconductor layer 102C may be made of any of a variety of different semiconductor materials. Moreover, the materials for the base semiconductor substrate 102A and the active semiconductor layer 102C need not be made of the same semiconductor material in all applications, but such a situation may occur in some applications. Similarly, the buried insulation layer 102B may be comprised of a variety of different insulating materials. The thicknesses of the active semiconductor layer 102C, the buried insulation layer 102B and the base semiconductor substrate 102A may vary depending upon the particular application. In accordance with some illustrative embodiments of the present disclosure, the active layer 102C may have a thickness of about 30 nm or less, e.g., in the range of about 10-20 nm, while the buried insulating layer 102B may be formed of one of silicon oxide and silicon nitride, and it may have a thickness of about 10-30 nm. In accordance with some illustrative embodiments of the present disclosure, the active layer 102C may be substantially un-doped (for FDSOI devices) or it may doped with an N-type or P-type dopant material where the transistor 100 is a PFET device or an NFET device, respectively. The base substrate 102A may be doped with P-type or N-type dopants for an NFET transistor and a PFET transistor, respectively.

The transistor 100 is formed in and above an active region defined in the active layer 102C by an isolation structure 130 that extends through the active layer 102C and the buried insulation layer 102B. FIGS. 1 and 2 are cross-sectional views of the transistor 100 taken through the transistor 100 in the gate length ("GL") direction of the transistor 100. The gate length (GL) direction of the transistor 100 is depicted in the drawings. The gate width ("GW") direction of the transistor 100 is orthogonal to the gate length direction of the transistor, i.e., the gate width direction extends into and out of the plane of the drawing page in Figures 1and 2.

The transistor 100 generally comprises a gate structure 107 (that includes an illustrative gate insulation layer 107A and an illustrative conductive gate electrode 107B), at least one sidewall spacer 111 (e.g., silicon nitride or a low-k material), a gate cap 112 (e.g., silicon nitride) and raised source/drain regions ("S" or "D") that are generally designated with the reference numeral 115. The doped region of the source/drain regions 115 that is formed in the active layer 102C is not depicted in the drawings. As will be appreciated by those skilled in the art, the conductive gate electrode 107B is the front gate for the transistor 100. The transistor 100 has a gate length 107L, a lateral mid-point 107E and opposing lateral sidewalls 107C, 107D. In the simplistic example depicted in the drawings, the sidewalls 107C, 107D of the gate structure 107 are depicted as being substantially vertically oriented sidewalls. In a real-world device, the sidewalls 107C, 107D may be tapered surfaces, wherein the gate structure 107 is wider at its bottom surface than at its top surface. Although only a single spacer 111 is shown in the attached drawings, those skilled in the art will appreciate that multiple sidewall spacers may be formed adjacent the gate structures 107 of the transistor 100.

Also depicted in FIG. 1 is a simplistically-depicted counter-doped back-gate region 122 that is formed in the base substrate 102A. That is, the counter-doped back-gate region 122 comprises dopant atoms that are of a type that is opposite the type of dopant atoms used to dope the base substrate 102A, i.e., if the base substrate 102A is doped with a P-type dopant, the counter-doped back-gate region 122 will be doped with an N-type dopant, and vice-versa. The counter-doped back-gate region 122 has a lateral width 122L in the gate length direction of the transistor device 100, a lateral mid-point 122A and opposing lateral sidewalls 122B, 122C. In one illustrative embodiment, the counter-doped back-gate region 122 also has a dimension in the gate width direction of the device that is at least equal to the entire gate width of the transistor device 100, but that may not be the case in all applications. In the illustrative example depicted in FIG. 1, the lateral width 122L of the counter-doped back-gate region 122 is greater than the gate length 107L of the transistor 100 and the lateral mid-point 122A of the counter-doped back-gate region 122 is approximately aligned with the lateral mid-point 107E of the gate structure 107. Of course, as will be appreciated by those skilled in the art after a complete reading of the present application, the length 122L of the counter-doped back-gate region 122 may be less than the gate length 107L of the transistor 100 and/or the counter-doped back-gate region 122 may be positioned asymmetrically relative to the gate structure 107, e.g., the lateral mid-point 122A of the counter-doped back-gate region 122 may be laterally offset (in the gate length direction) from the lateral mid-point 107E of the gate structure 107.

Also depicted in FIG. 1 is a simplistically-depicted counter-doped back-gate contact region 124 that is formed in the base substrate 102A and a conductive back-gate contact 126 that is conductively coupled to the back-gate contact region 124. The back-gate contact region 124 also comprises dopant atoms that are of a type that is opposite the doping of the base substrate 102A, i.e., if the base substrate 102A is doped with a P-type dopant, the counter-doped back-gate contact region 124 will be doped with an N-type dopant, and vice-versa. The counter-doped back-gate contact region 124 has a lateral width 124L in the gate length direction of the transistor device 100 and a sidewall 124A. The counter-doped back-gate contact region 124 also has a dimension in the gate width direction. In one illustrative example, the dimension of the counter-doped back-gate contact region 124 in the gate width direction may be at least equal to the entire gate width of the transistor device 100. In other applications, the dimension of the counter-doped back-gate contact region 124 in the gate width direction may be less than the entire gate width of the transistor device 100 since, as will be described more fully below, the counter-doped back-gate contact region 124 only provides a conductive path for a back-gate voltage that will be applied to the counter-doped back-gate region 122 via the conductive back-gate contact 126. The lateral width 124L of the counter-doped back-gate contact region 124 is independent of the lateral width 122L of the counter-doped back-gate region 122.

As depicted, the counter-doped back-gate region 122 and the counter-doped back-gate contact region 124 are separated by a portion 113 of the doped base substrate 102A that has a lateral width 113A in the gate length direction of the transistor device 100 and a transverse dimension in the gate width direction that is at least equal to the entire gate width of the transistor device 100. The lateral width 113A of the portion 113 of the base substrate 102A positioned between the regions 122, 124 may vary depending upon the particular application, e.g., 1 nm to about one-half of the length 122L of the counter-doped back-gate region 122.

The characteristics of the counter-doped back-gate region 122 and the counter-doped back-gate contact region 124, e.g., concentration of dopant atoms, vertical depth, the location of peak concentration of dopant atoms in the doped region, etc., may vary depending upon the particular application. In some applications, the characteristics of the counter-doped back-gate region 122 and the counter-doped back-gate contact region 124 may be substantially the same, e.g., they both may have approximately the same concentration of dopant atoms, but that may not be the case in all applications. In one illustrative example, the counter-doped back-gate region 122 and the counter-doped back-gate contact region 124 may both have a concentration of dopant atoms that falls within the range of about $1e^{16}$-$1e^{21}$ ions/cm$^3$, and the location of the peak concentration of dopant atoms in the doped regions 122, 124 may be positioned at approximately the interface between the base substrate 102A and the buried insulation layer 102B.

The exact process flow performed to produce the transistor 100 may vary depending upon the particular application. For example, the isolation structure 130 may be initially formed so as to define the active region where the transistor 100 will be formed. Thereafter, the counter-doped back-gate region 122 and the counter-doped back-gate contact region 124 may be formed by performing one or more known ion implantation processes through one or more patterned implantation masks (not shown), e.g., one or more patterned layers of photoresist. Thereafter, the basic components of the transistor 100, e.g., the gate structure 107, the spacer(s) 111, the gate cap 112 and the doped source/drain regions 115 may be manufactured using any of a variety of known manufacturing techniques. The gate structure 107 depicted is intended to be representative in nature of any type of gate structure that may be formed on transistor devices and it may be comprised of any of a variety of different materials. For example, the gate structure 107 may be manufactured using known gate-first or known replacement gate manufacturing techniques. In the example depicted herein, the gate structure 107 has been manufactured using a gate-first manufacturing technique. The illustrative gate insulation layer 107A may be comprised of a variety of different materials, such as, for example, silicon dioxide, a so-called high-k (k value greater than 10) insulation material, such as, for example hafnium oxide. Similarly, the conductive gate electrode 107B may comprise polysilicon and/or one or more layers of metal-containing material, such as, for example, titanium nitride, aluminum, tantalum, etc. In the example depicted herein, the doped source/drain regions 115 may be comprised of in-situ doped epitaxial semiconductor material that is formed by performing an epitaxial growth process. In other cases, dopant atoms may be introduced in the regions 115 by performing one or more ion implantation processes through one or more patterned implant masks. Of course, the doped source/drain regions 115 will be doped with a P-type dopant for a PFET transistor 100, while the doped source/drain regions 115 will be doped with an N-type dopant for an NFET transistor 100. At some point during the process flow, an opening 127 will be formed through the active layer 102C and the buried insulation layer 102A so as to expose at least a portion of the counter-doped back-gate contact region 124. Thereafter, the conductive back-gate contact 126 will be formed in the opening so as to conductively contact the counter-doped back-gate contact region 124. The conductive back-gate contact 126 may be comprised of any of a variety of different conductive materials, e.g., a metal-containing material, a doped semiconductor material, etc.

Certain operational characteristics of the transistor 100 will now be discussed. In the following example, it is assumed that the transistor 100 is an NFET transistor, wherein the base substrate 102A is doped with a P-type dopant and the counter-doped back-gate region 122 as well as the counter-doped back-gate contact region 124 are both doped with an N-type dopant material. As indicated, various voltages may be applied to the gate structure ("$V_G$"), the source region ("$V_S$"), the drain region ("$V_D$") and the back-gate ("$V_{BG}$"). These voltages may originate from any source and may be of any magnitude.

FIG. 1 depicts the transistor 100 in one illustrative operational configuration wherein the gate voltage ($V_G$) is approximately zero, a relatively low drain voltage ($V_D$), e.g., +0.5 volts, is applied to the drain and a relatively high back-gate voltage ($V_{BG}$), e.g., +3 volts, is applied to the conductive back-gate contact 126. In this condition the NFET transistor 100 is turned OFF and there is no conductive channel in the active layer 102C between the source/drain regions 115. Moreover, there is no conductive flow path between the counter-doped back-gate region 122 and the counter-doped back-gate contact region 124. Thus, the counter-doped back-gate region 122 is also OFF under this condition. With the back-gate OFF, the transistor 100 would exhibit certain operational characteristics if an appropriate gate voltage ($V_G$) was applied to the gate electrode 107B so as to turn the transistor 100 ON, e.g., the transistor 100 would exhibit an inherent initial threshold voltage, an inherent switching speed and it would exhibit an inherent amount of leakage current during operation.

FIG. 2 depicts the NFET transistor wherein the gate voltage ($V_G$) remains at approximately zero and the relatively high back-gate voltage ($V_{BG}$), e.g., +3 volts, is still applied to the conductive back-gate contact 126. However, the drain voltage ($V_D$) has been increased to a relatively high level, e.g., +3 volts. In this condition, the NFET transistor 100 is still OFF. As a result of the increased drain voltage ($V_D$), a conductive inversion layer or channel 128 of N-type dopants forms in the portion 113 of the P-doped base substrate 102A that separated the counter-doped back-gate region 122 and the counter-doped back-gate contact region 124. As will be appreciated by those skilled in the art after a complete reading of the present application, the portion 113 of the P-doped base substrate 102A does not respond as quickly to an applied voltage to the font gate 107 as does the counter-doped back-gate region 122 due to the lower doping levels in the portion 113 as compared to the counter-doped back-gate region 122. The application of the relatively higher positive voltage to the drain region effectively attracts electrons in the P-doped base substrate 102A into the portion 113 of the base substrate 102A located between the counter-doped back-gate region 122 and the counter-doped back-gate contact region 124. As a result, the counter-doped back-gate region 122 is now conductively coupled to the counter-doped back-gate contact region 124. Thus, the back-gate voltage ($V_{BG}$) is now applied to the counter-doped back-gate region 122 via the conductive back-gate contact 126, the counter-doped back-gate contact region 124 and the conductive channel 128 so as to turn the back-gate of the transistor 100 ON. With the counter-doped back-gate region 122 at +3 volts, the operational characteristics of the transistor 100 are changed as compared to the operational characteristics of the transistor 100 with the back-gate OFF. More specifically, with the back-gate of the transistor 100 ON, the threshold voltage of the transistor 100 is reduced, its switching speed is increased, but it would exhibit a relatively higher leakage current.

Thus, the present transistor design provides systems designers with the ability to alter the characteristic of the transistor 100 on an as-needed or on-demand basis. For example, in the case where there is a high demand for faster processing of information, the back-gate of the transistor 100 may be turned ON so as to permit the transistor 100 to operate at faster switching speeds during the period of peak demand, with accepted trade-off of higher leakage currents during the high-demand period. After the high-demand period has passed, the back-gate may be turned off and the transistor 100 may be allowed to operate at its relatively slower operational speed so as to conserve power. Of course, as will be appreciated by those skilled in the art after a complete reading of the present application, the above operational sequence could be equally applied to a PFET transistor wherein the applied voltages would be negative instead of positive.

In the illustrative example depicted in FIGS. 1-2 and described above, the conductive inversion layer or channel 128 of N-type dopants was created by application of a relatively high positive voltage to the drain region of the NFET transistor 100. However, as will be appreciated by those skilled in the art after a complete reading of the present application, a similar result could be achieved by shifting the location of the conductive inversion layer or channel 128 closer to the drain region with the understanding that implant conditions and applied voltages would need to be adjusted.

Figure 3:
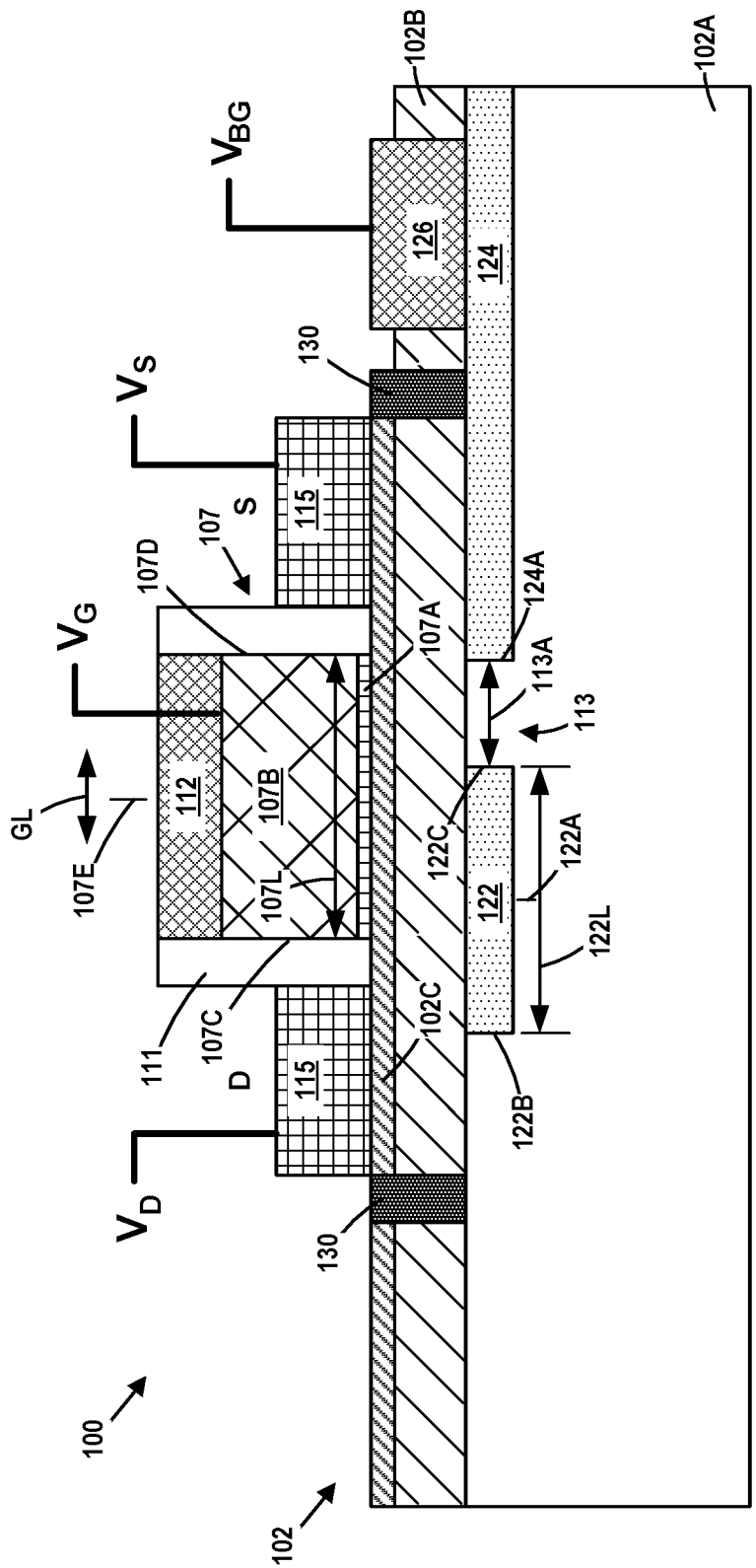
FIGS. 3-4 depict another novel integrated circuit (IC) product that includes another illustrative embodiment of a transistor device disclosed herein wherein the transistor comprises a plurality of active gates that can be individually modulated to change the performance characteristics of the transistor device, such as, for example, the threshold voltage of the transistor.
Figure 4:
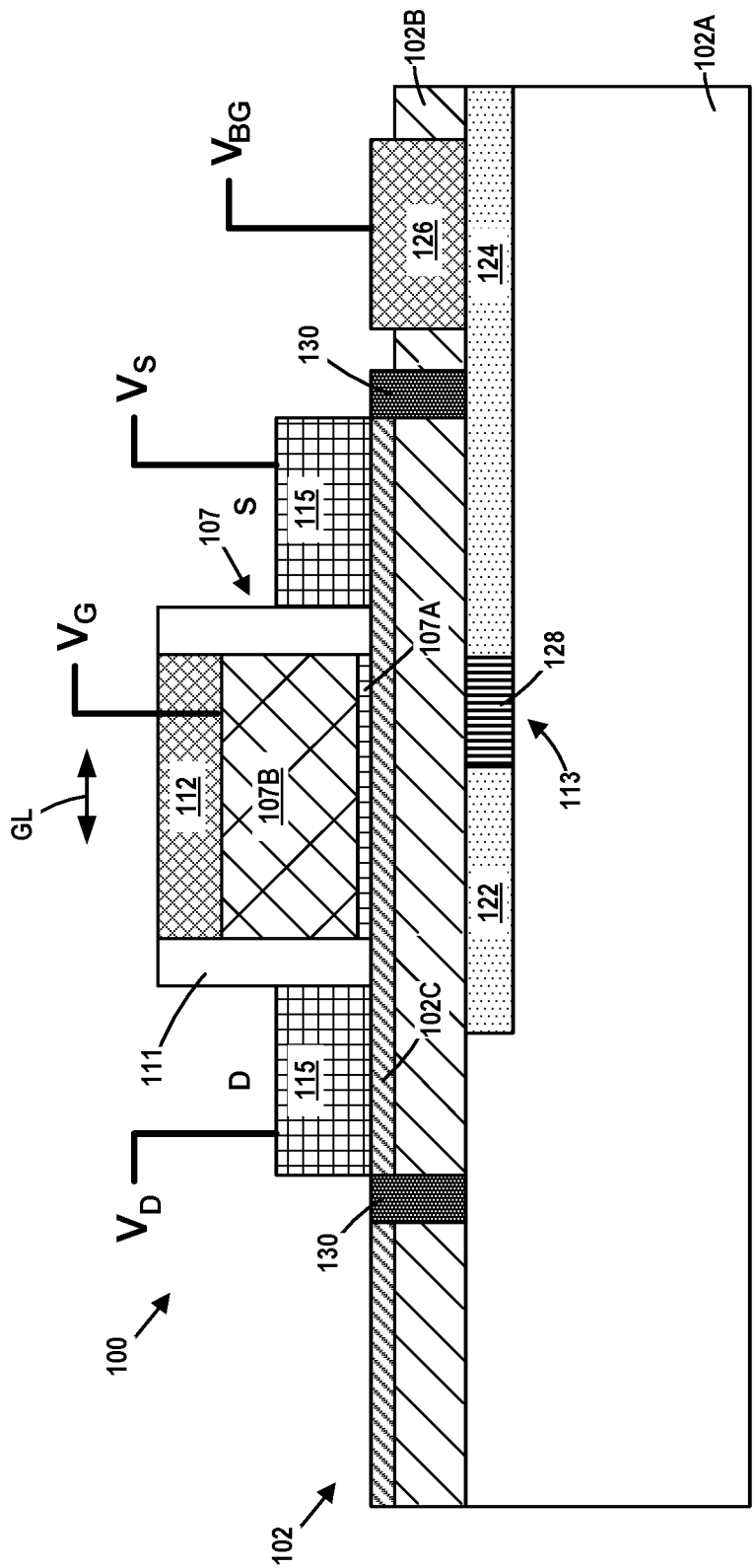

FIGS. 3-4 depict another novel integrated circuit (IC) product that includes another illustrative embodiment of a transistor device 100 disclosed herein wherein the transistor 100 comprises a front-gate and a back-gate so as to permit or enable modulating the performance characteristics of the transistor device 100, such as, for example, the threshold voltage of the transistor 100. The transistor device 100 depicted in FIGS. 2-3 contains many common features or elements relative to the embodiment of the transistor 100 described above with respect to FIGS. 1-2 above. Thus, the description of various elements having the same reference number applies equally to all embodiments.

In general, with respect to the embodiment of the transistor 100 shown in FIGS. 1-2, the formation of the conductive inversion layer or channel 128 between the counter-doped back-gate region 122 and the counter-doped back-gate contact region 124 was accomplished by applying a relatively high voltage (positive or negative depending upon whether the transistor 100 was an NFET or a PFET device, respectively) to the drain region of the transistor 100. In the embodiment of the transistor 100 shown in FIGS. 2-4, the formation of the conductive inversion layer or channel 128 between the counter-doped back-gate region 122 and the counter-doped back-gate contact region 124 is accomplished by applying a voltage (positive or negative depending upon whether the transistor 100 was an NFET or a PFET device, respectively) to the conductive gate electrode 107B, i.e., the front gate of the transistor 100.

In the illustrative example of the transistor depicted in FIGS. 3-4, the lateral width 122L of the above-described counter-doped back-gate region 122 is less than the gate length 107L of the transistor 100. However, that may not be the case in all applications. Additionally, the lateral midpoint 122A of the counter-doped back-gate region 122 is laterally offset (in the gate length direction) from the lateral mid-point 107E of the gate structure 107. The magnitude of this lateral offset may vary depending upon the particular application. The device also includes the above-described counter-doped back-gate contact region 124. In this example, the gate-side sidewall 124A of the counter-doped back-gate contact region 124 is positioned at a location vertically below the gate structure 107 and laterally inward of the gate sidewall 107D. The amount of offset between the sidewall 124A and the sidewall 107D of the gate structure 107 may vary depending upon the particular application. As before, the counter-doped back-gate region 122 and the counter-doped back-gate contact region 124 are separated by the above-described portion 113 of the doped base substrate 102A. In this embodiment, the drain region is to the left of the gate structure 107 while the source region is to the right of the gate structure 107.

Certain operational characteristics of the illustrative embodiment of the transistor 100 depicted in FIGS. 3-4 will now be discussed. As before, in the following example, it is assumed that the transistor 100 depicted in FIGS. 3-4 is an NFET transistor, wherein the base substrate 102A is doped with a P-type dopant and the counter-doped back-gate region 122 as well as the counter-doped back-gate contact region 124 are both doped with an N-type dopant material. As before, various voltages may be applied to the gate structure ($V_G$), the source region ($V_S$), the drain region ($V_D$) and the back-gate ($V_{BG}$). As before, these voltages may originate from any source and be of any magnitude.

FIG. 3 depicts the transistor 100 in one illustrative operational configuration wherein the gate voltage ($V_G$) is approximately zero, a relatively high back-gate voltage ($V_{BG}$), e.g., +3 volts, is applied to the conductive back-gate contact 126 and drain voltage ($V_D$) and source voltage ($V_S$) are either zero or relatively low, e.g., +0.5 volts. In this condition, the NFET transistor 100 is turned OFF and there is no conductive channel in the active layer 102C between the source/drain regions 115. Moreover, there is no conductive flow path or conductive channel between the counter-doped back-gate region 122 and the counter-doped back-gate contact region 124. Thus, the counter-doped back-gate region 122 is also OFF under this condition. As before, with the back-gate OFF, the transistor 100 would exhibit certain operational characteristics if an appropriate gate voltage ($V_G$) was applied so as to turn the transistor 100 ON, e.g., the transistor 100 would exhibit an inherent initial threshold voltage, an inherent switching speed and it would exhibit an inherent amount of leakage current during operation.

FIG. 4 depicts the NFET transistor 100 wherein a positive voltage is applied to the gate electrode 107B so as to turn the transistor ON and the relatively high back-gate voltage ($V_{BG}$), e.g., +3 volts, is still applied to the conductive back-gate contact 126. The magnitude of the applied gate voltage ($V_G$), e.g., 0.1-20 volts, is sufficient to cause the formation of the above-described conductive inversion layer or channel 128 of N-type dopants in the portion 113 of the P-doped base substrate 102A that separated the counter-doped back-gate region 122 and the counter-doped back-gate contact region 124. The application of the positive gate voltage ($V_G$) to gate 107 effectively attracts electrons in the P-doped base substrate 102A into the portion 113 of the base substrate 102A located between the counter-doped back-gate region 122 and the counter-doped back-gate contact region 124. As a result, the counter-doped back-gate region 122 is now conductively coupled to the counter-doped back-gate contact region 124. Thus, the back-gate voltage ($V_{BG}$) is now applied to the counter-doped back-gate region 122 via the conductive back-gate contact 126, the counter-doped back-gate contact region 124 and the conductive channel 128 so as to turn the back-gate of the transistor 100 ON. With the counter-doped back-gate region 122 at +3 volts, the operational characteristics of the transistor 100 are changed as compared to the operational characteristics of the transistor 100 with the back-gate OFF. More specifically, the threshold voltage of the transistor 100 is reduced, its switching speed is increased, but it would exhibit a relatively higher leakage current. As with the previous embodiment, this embodiment of the transistor 100 provides systems designers with the ability to alter the characteristic of the transistor on an as-needed or on-demanded basis.

In view of the foregoing embodiments, and as will be appreciated by those skilled in the art after a complete reading of the present application, an appropriate voltage can be applied to any of the terminals of the transistor 100, i.e., the gate, the source or the drain, so as to cause the formation of the conductive inversion layer or channel 128. As noted above, the back-gate voltage ($V_{BG}$) may be supplied from any source, e.g., an external voltage source, a terminal voltage of another transistor, etc.

Figure 5:
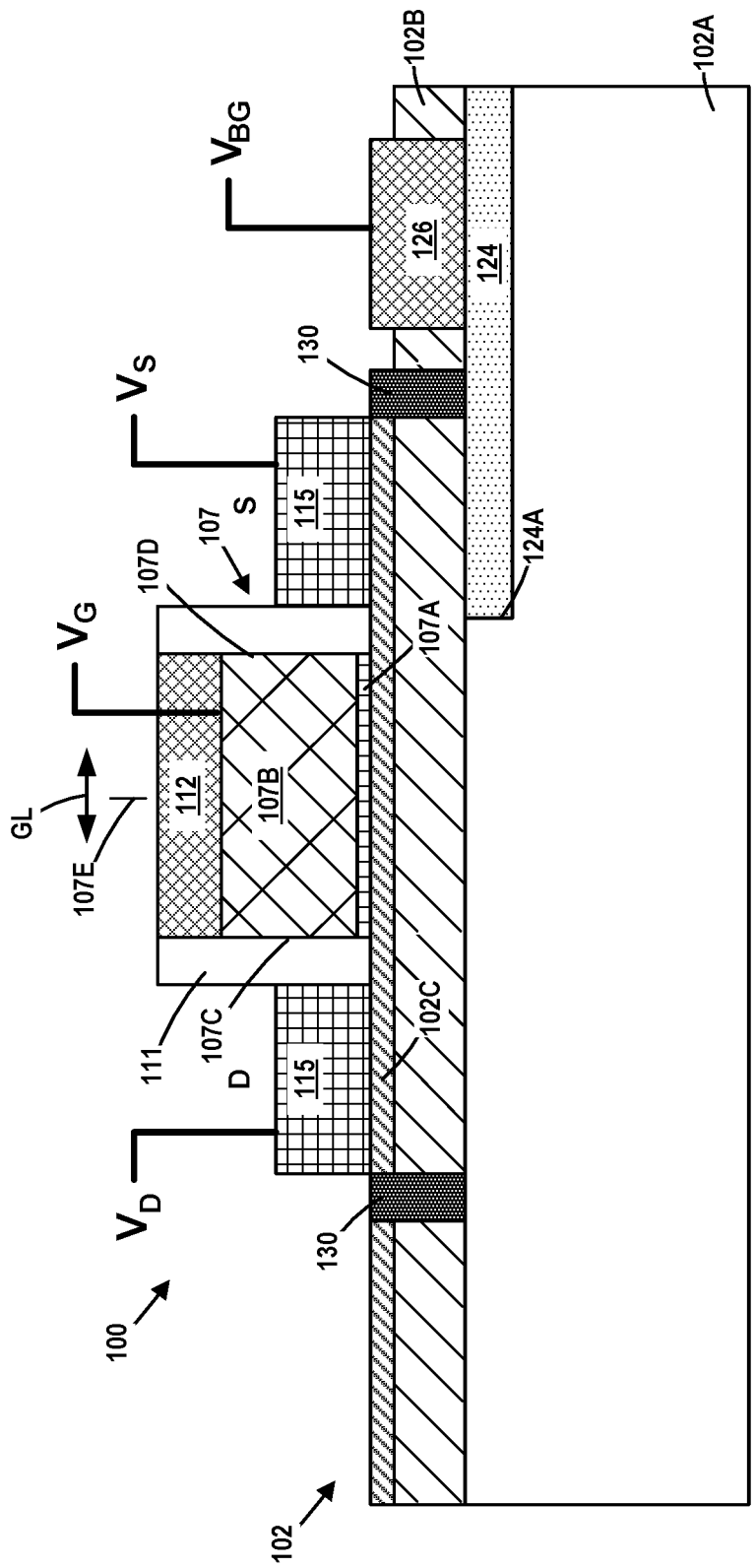
FIGS. 5-6 depict yet another novel integrated circuit (IC) product that includes yet another illustrative embodiment of a transistor device disclosed herein wherein the transistor comprises a plurality of active gates that can be individually modulated to change the performance characteristics of the transistor device, such as, for example, the threshold voltage of the transistor.
Figure 6:
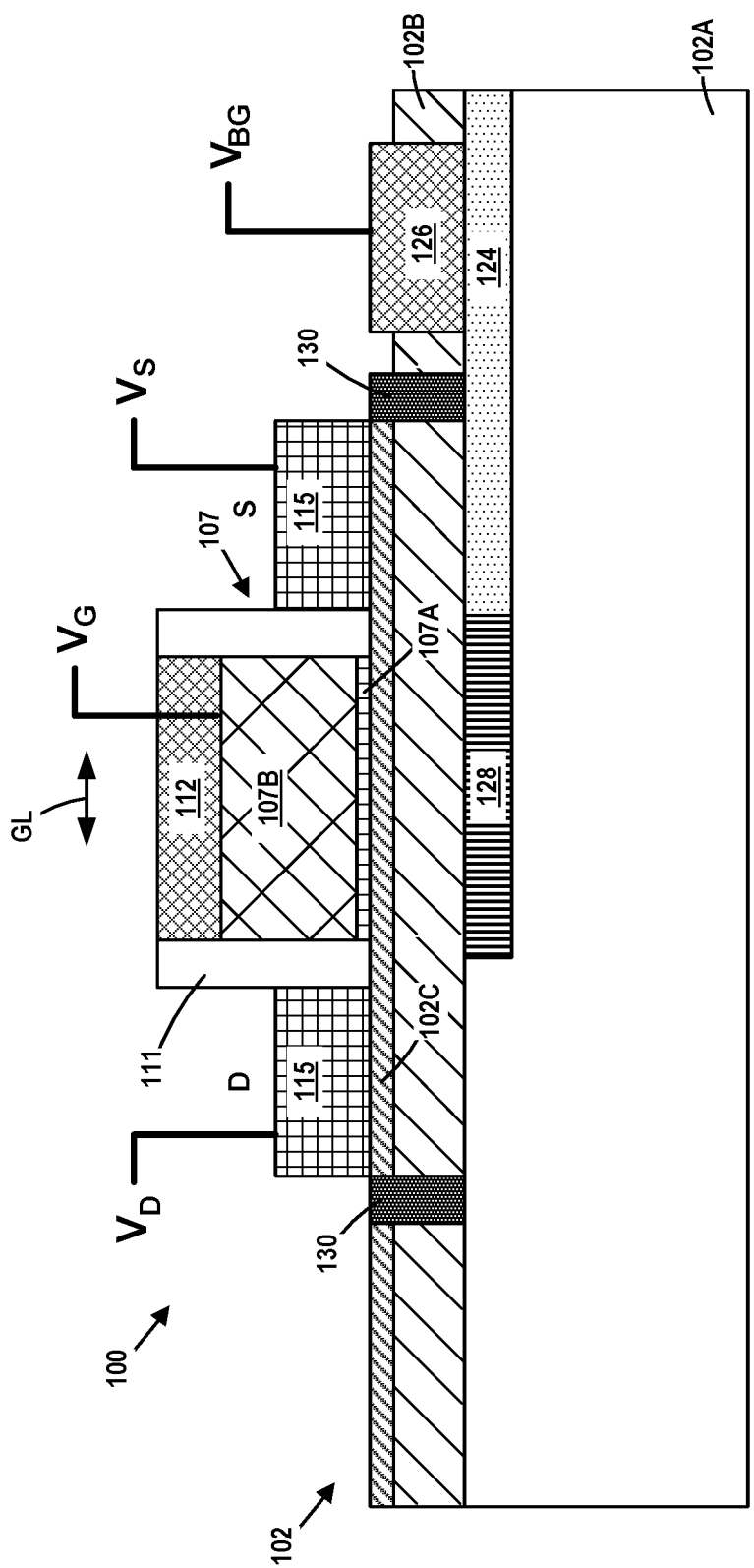

FIGS. 5-6 depict yet another novel integrated circuit (IC) product that includes yet another illustrative embodiment of a transistor device 100 disclosed herein wherein the transistor 100 comprises a front-gate and a back-gate so as to permit or enable modulating the performance characteristics of the transistor device 100, such as, for example, the threshold voltage of the transistor 100. The transistor depicted in FIGS. 5-6 is substantially the same as the embodiment shown in FIGS. 3-4, with the exception that this embodiment of the transistor does not include the above-described counter-doped back-gate region 122. In this embodiment, the back-gate of the transistor will be the conductive channel or inversion layer 128 that will be formed in the base substrate 102A under the gate structure 107 by applying a voltage (positive or negative depending upon whether the transistor 100 was an NFET or a PFET device, respectively) to the conductive gate electrode 107B, i.e., the front gate of the transistor 100. The conductive channel 128 will conductively contact the counter-doped back-gate contact region 124. Accordingly, the back-gate voltage ($V_{BG}$) may be applied to the conductive channel 128—the back-gate of the transistor 100—via the conductive back-gate contact 126 and counter-doped back-gate contact region 124.

In this example, the gate-side sidewall 124A of the counter-doped back-gate contact region 124 is positioned at a location laterally outward of the gate sidewall 107D, but it could be located inward of the gate sidewall 107D in other applications. The amount of offset between the sidewall 124A and the sidewall 107D of the gate structure 107 may vary depending upon the particular application.

Certain operational characteristics of the illustrative embodiment of the transistor 100 depicted in FIGS. 5-6 will now be discussed. As before, in the following example, it is assumed that the transistor 100 depicted in FIGS. 5-6 is an NFET transistor, wherein the base substrate 102A is doped with a P-type dopant and the counter-doped back-gate contact region 124 is doped with an N-type dopant material. As before, various voltages may be applied to the gate structure ($V_G$), the source region ($V_S$), the drain region ($V_D$) and the back-gate ($V_{BG}$). As before, these voltages may originate from any source and be of any magnitude.

FIG. 5 depicts the transistor 100 in one illustrative operational configuration wherein the gate voltage ($V_G$) is approximately zero, a relatively high back-gate voltage ($V_{BG}$), e.g., +3 volts, is applied to the conductive back-gate contact 126 and the drain voltage ($V_D$) and the source voltage ($V_S$) are either zero or relatively low, e.g., +0.5 volts. In this condition, the NFET transistor 100 is turned OFF and there is no conductive channel in the active layer 102C between the source/drain regions 115. Moreover, there is no conductive back-gate in the base substrate 102A beneath the gate structure 107. As before, in the absence of a conductive back-gate, the transistor 100 would exhibit certain operational characteristics if an appropriate gate voltage ($V_G$) was applied so as to turn the transistor 100 ON, e.g., the transistor 100 would exhibit an inherent initial threshold voltage, an inherent switching speed and it would exhibit an inherent amount of leakage current during operation.

Figure 7:
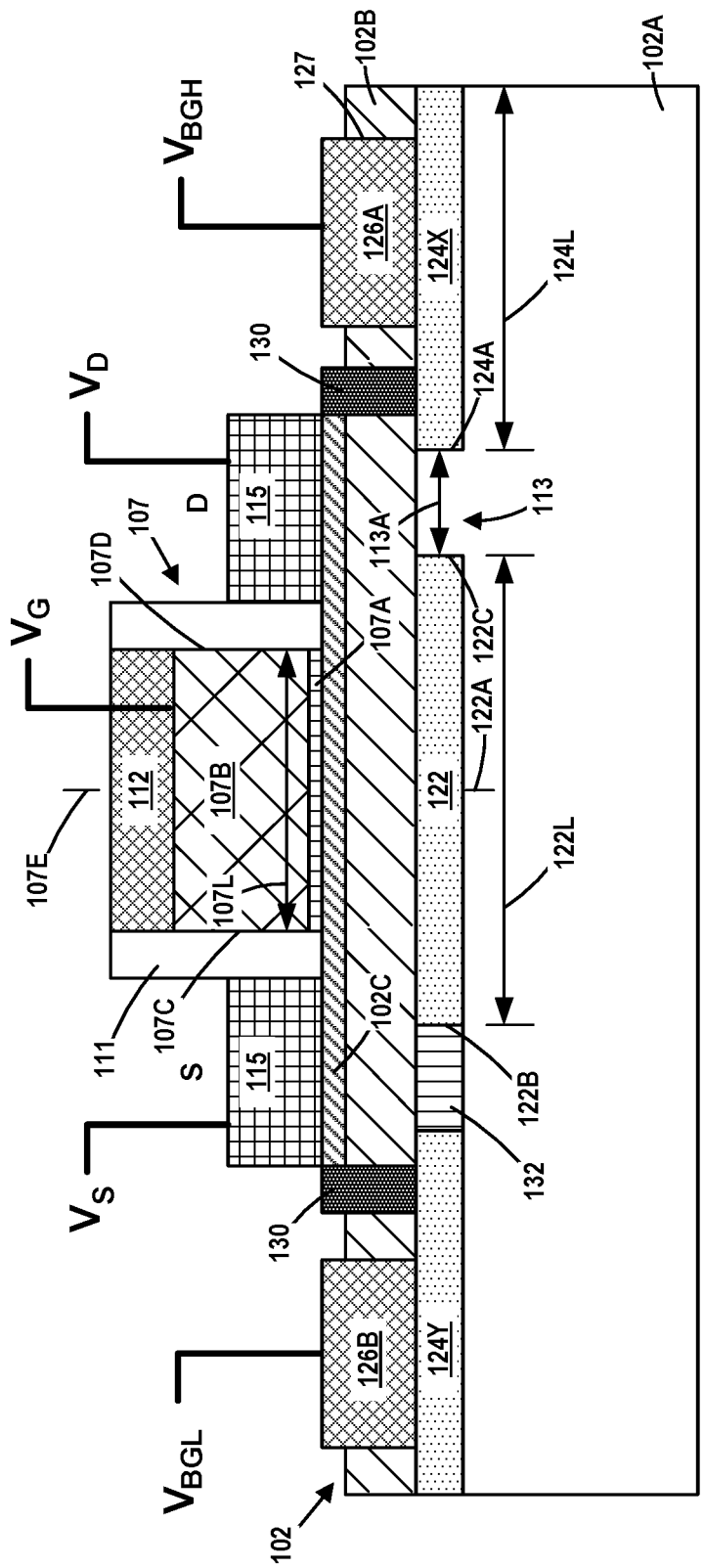
FIGS. 7-8 depict yet another novel integrated circuit (IC) product that includes one illustrative embodiment of a transistor device disclosed herein wherein the transistor comprises a plurality of active gates that can be individually modulated to change the performance characteristics of the transistor device, such as, for example, the threshold voltage of the transistor. The drawings herein are not to scale While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.
Figure 8:
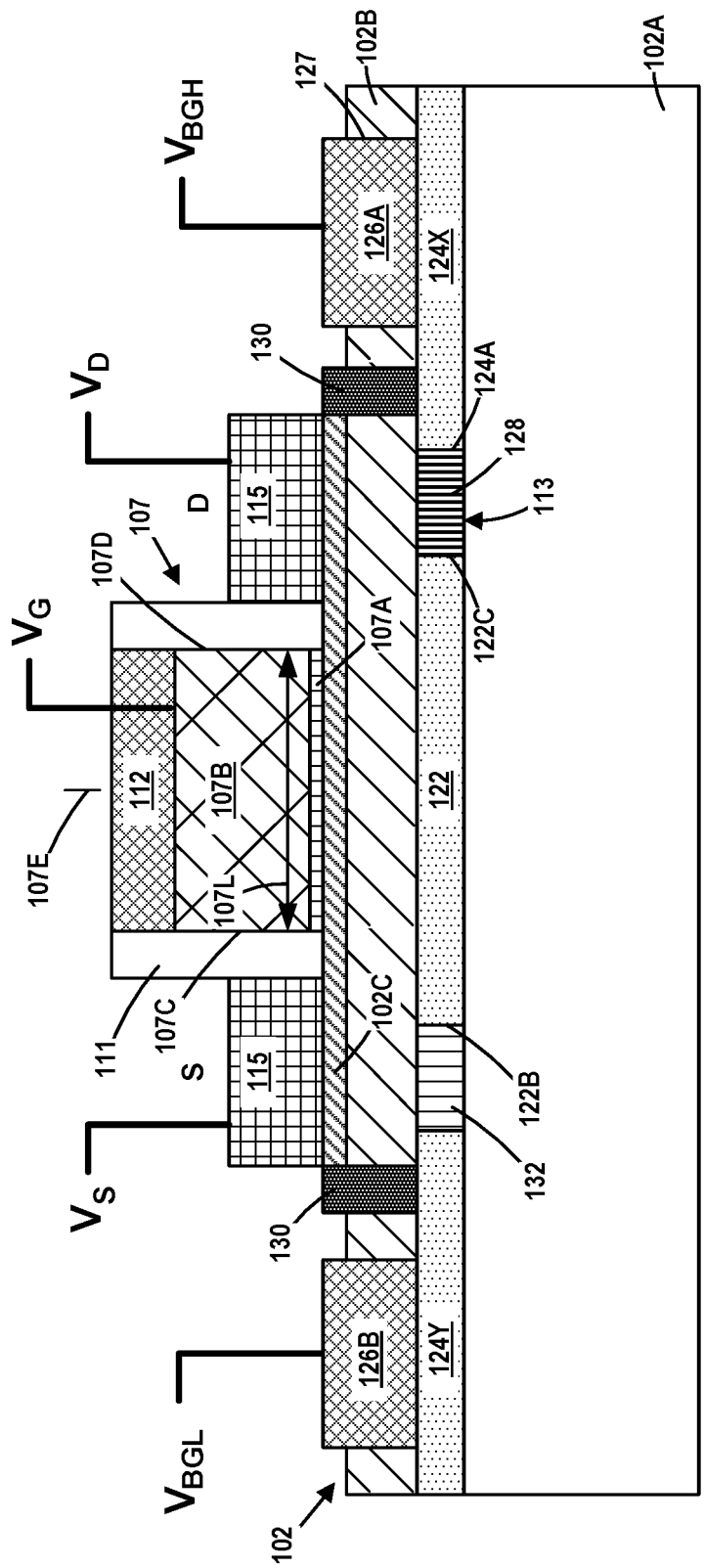

FIG. 6 depicts the NFET transistor 100 wherein a positive voltage is applied to the gate electrode 107B so as to turn the transistor 100 ON and the relatively high back-gate voltage ($V_{BG}$), e.g., +3 volts, is still applied to the conductive back-gate contact 126. The magnitude of the applied gate voltage ($V_G$), e.g., 0.1-20 volts, is sufficient to cause the formation of the above-described conductive inversion layer or channel 128 of N-type dopants in the P-doped base substrate 102A at a location below the gate structure 107. The application of the positive gate voltage ($V_G$) to the gate 107 effectively attracts electrons in the P-doped base substrate 102A into the area under the gate structure 107. As a result, the conductive inversion layer or channel 128 is now conductively coupled to the counter-doped back-gate contact region 124. Thus, the back-gate voltage ($V_{BG}$) is now applied to the conductive inversion layer or channel 128 via the conductive back-gate contact 126 and the counter-doped back-gate contact region 124, thereby turning the back-gate of the transistor 100 ON. With the back-gate at +3 volts, the inherent operational characteristics of the transistor 100 with the back-gate OFF are changed. More specifically, the threshold voltage of the transistor 100 is reduced, its switching speed is increased, but it would exhibit a relatively higher leakage current. As with the previous embodiment, this embodiment of the transistor 100 provides systems designers with the ability to alter the characteristic of the transistor on an as-needed or on-demanded basis FIGS. 7-8 depict yet another novel integrated circuit (IC) product that includes another illustrative embodiment of a transistor device 100 disclosed herein wherein the transistor 100 comprises a front-gate and a back-gate so as to permit or enable modulating the performance characteristics of the transistor device 100, such as, for example, the threshold voltage of the transistor 100. Relative to previous embodiments discussed above, in this embodiment, the transistor 100 includes two conductive back-gate contacts (designated as 126A, 126B), each of which is conductively coupled to one of two counter-doped back-gate contact regions (designated 124X, 124Y) formed in the base substrate 102A. The back-gate contact 126A is adapted to be coupled to a relatively higher back-gate voltage ("$V_{BGH}$"), while the back-gate contact 126B is adapted to be coupled to a relatively lower back-gate voltage ("$V_{BGL}$"). The difference in the magnitude between the high back-gate voltage ($V_{BGH}$) and the low back-gate voltage ($V_{BGL}$) may vary depending upon the particular application. In one illustrative embodiment, the difference between the high back-gate voltage ($V_{BGH}$) and the low back-gate voltage ($V_{BGL}$) may be about 0.1-20 volts. For high performance (high speed switching) and low leakage operation, both the high back-gate voltage ($V_{BGH}$) and the low back-gate voltage ($V_{BGL}$) will be of the same polarity (either positive or negative). For low leakage performance (slower switching speeds), the high back-gate voltage ($V_{BGH}$) and the low back-gate voltage ($V_{BGL}$) may be different polarities.

The embodiment of the transistor 100 shown in FIGS. 7-8 also includes a simplistically-depicted counter-doped transition region 132 that, in the depicted example, is formed in the base substrate 102A between the back-gate contact region 124Y and the counter-doped back-gate region 122. In this example, the counter-doped back-gate region 122 and the counter-doped back-gate contact region 124X are separated by a portion 113 of the doped base substrate 102A. Of course, as will be appreciated by those skilled in the art after a complete reading of the present application, if desired, the counter-doped transition region 132 could be formed between the back-gate contact region 124X and the counter-doped back-gate region 122 and the portion 113 of the doped base substrate 102A could be positioned between the back-gate contact region 124Y and the counter-doped back-gate region 122.

The counter-doped transition region 132 also comprises dopant atoms that are of a type that is opposite the doping of the base substrate 102A, i.e., if the base substrate 102A is doped with a P-type dopant, the counter-doped transition region 132 will be doped with an N-type dopant, and vice-versa. Thus, the counter-doped transition region 132 comprises the same dopant type as that of the back-gate contact regions 124X, 124Y and the counter-doped back-gate region 122. The counter-doped transition region 132 contacts or overlaps with the back-gate contact region 124Y and the counter-doped back-gate region 122. The counter-doped transition region 132 also has a dimension in the gate width direction. In one illustrative example, the dimension of the counter-doped transition region 132 in the gate width direction may be at least equal to the entire gate width of the transistor device 100. In other applications, the dimension of the counter-doped transition region 132 in the gate width direction may be less than the entire gate width of the transistor device 100 since, as will be described more fully below, the counter-doped transition region 132 only provides a conductive path for a back-gate voltage that will be applied to the counter-doped back-gate region 122 via the conductive back-gate contact 126B.

The characteristics of the counter-doped transition region 132, e.g., concentration of dopant atoms, vertical depth, location of peak concentration of dopants, etc., may vary depending upon the particular application. In one illustrative embodiment, the concentration of dopant atoms in the counter-doped transition region 132 may fall within the range of about $1e^{16}$-$1e^{21}$ ions/cm$^3$, and the location of the peak concentration of dopant atoms in the counter-doped transition region 132 may be positioned at approximately the interface between the base substrate 102A and the buried insulation layer 102B. In general, the concentration of dopant atoms in the counter-doped transition region 132 will be less than the concentration of dopant atoms in both the counter-doped back-gate region 122 and the counter-doped back-gate contact region 124. In one illustrative example, the difference in concentration of dopant atoms in the counter-doped transition region 132 as compared to the counter-doped back-gate region 122 and the counter-doped back-gate contact region 124 may be about $1e^{15}$-$1e^{20}$ ions/cm$^3$.

Certain operational characteristics of the illustrative embodiment of the transistor 100 depicted in FIGS. 7-8 will now be discussed. As before, in the following example, it is assumed that the transistor 100 depicted in FIGS. 7-8 is an NFET transistor, wherein the base substrate 102A is doped with a P-type dopant and the counter-doped back-gate contact regions 124X, 124Y, the counter-doped back-gate region 122 and the counter-doped transition region 132 are doped with an N-type dopant material. As before, various voltages may be applied to the gate structure ($V_G$), the source region ($V_S$), the drain region ($V_D$), a relatively high back-gate voltage ($V_{BGH}$) that is applied to the back-gate contact 126A and a relatively low back-gate voltage ($V_{BGL}$) that is applied to the back-gate contact 126B. As before, these voltages may originate from any source and be of any magnitude.

As before, in this embodiment, an appropriate voltage may be applied to one of the terminals (e.g., the gate, the source or the drain) of the transistor 100 to cause the formation of the conductive inversion layer or channel 128 in the portion 113 of the base substrate 102A between the back-gate region 122 and the back-gate contact region 124X. FIG. 7 depicts the transistor prior to the formation of the conductive inversion layer or channel 128. FIG. 8 depicts the transistor 100 after the conductive inversion layer or channel 128 has been formed.

FIG. 7 depicts the transistor 100 in one illustrative operational configuration wherein the gate voltage ($V_G$) is approximately zero, a relatively low drain voltage ($V_D$), e.g., +0.5 volts, is applied to the drain, a relatively high back-gate voltage ($V_{BGH}$), e.g., +3 volts, is applied to the conductive back-gate contact 126A, and a relatively low back-gate voltage ($V_{BGL}$) is applied to the back-gate contact 126B. In this condition, the NFET transistor 100 is turned OFF and there is no conductive channel in the active layer 102C between the source/drain regions 115. Moreover, there is no conductive flow path between the counter-doped back-gate region 122 and the counter-doped back-gate contact region 124X. Thus, the counter-doped back-gate region 122 is also OFF under this condition. With the back-gate OFF, the transistor 100 would exhibit certain operational characteristics if an appropriate gate voltage ($V_G$) was applied to the gate electrode 107B so as to turn the transistor 100 ON, e.g., the transistor 100 would exhibit an inherent initial threshold voltage, an inherent switching speed and it would exhibit an inherent amount of leakage current during operation.

FIG. 8 depicts the NFET transistor wherein the gate voltage ($V_G$) remains at approximately zero, the relatively high back-gate voltage ($V_{BGH}$), e.g., +3 volts, is still applied to the conductive back-gate contact 126A and the relatively low back-gate voltage ($V_{BGL}$) is still applied to the back-gate contact 126B. However, the drain voltage ($V_D$) has been increased to a relatively high level, e.g., +3 volts. In this condition, the NFET transistor 100 is still OFF. As a result of the increased drain voltage ($V_D$), the conductive inversion layer or channel 128 of N-type dopants has formed in the portion 113 of the P-doped base substrate 102A that separates the counter-doped back-gate region 122 and the counter-doped back-gate contact region 124X. The application of the relatively higher positive voltage to the drain region effectively attracts electrons in the P-doped base substrate 102A into the portion 113 of the base substrate 102A located between the counter-doped back-gate region 122 and the counter-doped back-gate contact region 124X. As a result, the counter-doped back-gate region 122 is now conductively coupled to the counter-doped back-gate contact region 124X. Thus, the high back-gate voltage ($V_{BGH}$) is now applied to the counter-doped back-gate region 122 via the conductive back-gate contact 126A, the counter-doped back-gate contact region 124X and the conductive channel 128 so as to turn the back-gate of the transistor 100 ON. With the counter-doped back-gate region 122 at +3 volts, the operational characteristics of the transistor 100 are changed as compared to the operational characteristics of the transistor 100 with the back-gate OFF. More specifically, with the back-gate of the transistor 100 ON, the threshold voltage of the transistor 100 is reduced, its switching speed is increased, but it would exhibit a relatively higher leakage current.

Unlike the previous embodiments, in this embodiment, the coupling of the back-gate region 122 to both the high back-gate voltage ($V_{BGH}$) and the low back-gate voltage ($V_{BGL}$) provides significant flexibility as it relates to achieving the desired operational characteristics of the transistor 100. That is, when the back-gate 122 is not connected, the operational characteristics of the transistor device are such that it exhibits relatively low leakage currents. However, by increasing the bias applied to the back-gate region 122, the performance characteristics, e.g., the switching speed of the device, may be increased.

As will be appreciated by those skilled in the art after a complete reading of the present application, there are several novel devices and method disclosed herein. One illustrative device disclosed herein includes a gate structure 107 positioned above an active semiconductor layer 102C of an SOI substrate 102 and a counter-doped back-gate region 122 positioned in the doped base semiconductor substrate 102A of the SOI substrate 102. In this particular embodiment, the device 100 also includes a counter-doped back-gate contact region 124 positioned in the base semiconductor substrate 102A, wherein the counter-doped back-gate region 122 and the counter-doped back-gate contact region 124 are doped with a dopant type that is opposite to the dopant type in the base semiconductor substrate 102A. In this illustrative example, the counter-doped back-gate region 122 and the counter-doped back-gate contact region 124 are laterally separated from one another by a portion of the doped base semiconductor substrate 102A. The device also includes a conductive back-gate contact structure 126 that is conductively coupled to the counter-doped back-gate contact region 124.

Yet another illustrative device disclosed herein includes a gate structure 107 positioned above an active semiconductor layer 102C of an SOI substrate 102, a source region, a drain region and a counter-doped back-gate contact region 124 positioned in the base semiconductor substrate 102A of the SOI substrate 102, wherein the counter-doped back-gate region 124 is doped with a dopant type that is opposite the dopant type in the base semiconductor substrate 102A. In this example, the counter-doped back-gate contact region 124 is positioned at least partially vertically below the conductive gate electrode of the gate structure 107 and the device further includes a conductive back-gate contact structure 126 that is conductively coupled to the counter-doped back-gate contact region 124.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A transistor having a gate length and a gate width, the transistor comprising:
    a semiconductor-on-insulator (SOI) substrate comprising a doped base semiconductor substrate, an active semiconductor layer and a buried insulation layer positioned between the doped base semiconductor substrate and the active semiconductor layer, the doped base semiconductor substrate being doped with a dopant material of a first type;
    a gate structure positioned above the active semiconductor layer, a source region and a drain region, the gate structure comprising a conductive gate electrode;
    a counter-doped back-gate region positioned in the doped base semiconductor substrate;
    a counter-doped back-gate contact region positioned in the doped base semiconductor substrate, wherein the counter-doped back-gate region and the counter-doped back-gate contact region are doped with a second dopant type that is opposite the first type and wherein the counter-doped back-gate region and the counter-doped back-gate contact region are laterally separated from one another by a portion of the doped base semiconductor substrate;
    a conductive back-gate contact structure that is conductively coupled to an upper surface of the counter-doped back-gate contact region; and
    an isolation structure on the upper surface of the counter-doped back-gate contact region, wherein a lower surface of the isolation structure is substantially coplanar with a lower surface of the conductive back-gate contact structure.

2. The transistor of claim 1, wherein a conductive flow path is adapted to be formed in the doped base semiconductor substrate between the counter-doped back-gate contact region and the counter-doped back-gate region upon application of an appropriate voltage to one of the gate electrode, the source region or the drain region.

3. The transistor of claim 1, wherein the counter-doped back-gate region has a first dimension in the direction of the gate width of the transistor, wherein the first dimension is at least as great as the gate width of the transistor.

4. The transistor of claim 3, wherein the counter-doped back-gate region has a second dimension in the direction of the gate length of the transistor, wherein the second dimension is greater that the gate length of the transistor.

5. The transistor of claim 1, wherein, when viewed in a cross-section of the transistor that is taken through the transistor in the gate length direction, at least a portion of the counter-doped back-gate region is positioned vertically below the conductive gate electrode.

6. The transistor of claim 1, wherein the entirety of the conductive gate electrode is positioned vertically above the counter-doped back-gate region.

7. The transistor of claim 1, wherein only a portion of the conductive gate electrode is positioned vertically above the counter-doped back-gate region.

8. The transistor of claim 1, wherein a lateral mid-point of the counter-doped back-gate region is substantially vertically aligned with a lateral mid-point of the gate structure.

9. The transistor of claim 1, wherein a lateral mid-point of the counter-doped back-gate region is laterally offset from a lateral mid-point of the gate structure.

10. The transistor of claim 1, wherein the counter-doped back-gate contact region has a dimension in the direction of the gate width of the transistor that is at least equal to the gate width dimension of the transistor.

11. The transistor of claim 1, wherein the counter-doped back-gate region has a first dimension in the direction of the gate width of the transistor and a second dimension in the direction of the gate length of the transistor, wherein the first dimension is at least equal to the gate width of the transistor, wherein the second dimension is greater than the gate length of the transistor and wherein a lateral mid-point of the counter-doped back-gate region is substantially vertically aligned with a lateral mid-point of the gate structure.

12. The transistor of claim 1, wherein the counter-doped back-gate region and the counter-doped back-gate contact region have substantially the same concentration of dopant atoms of the second type.

13. A transistor having a gate length and a gate width, the transistor comprising:
    a semiconductor-on-insulator (SOI) substrate comprising a doped base semiconductor substrate, an active semiconductor layer and a buried insulation layer positioned between the doped base semiconductor substrate and the active semiconductor layer, the doped base semiconductor substrate being doped with a dopant material of a first type;

a gate structure positioned above the active semiconductor layer, a source region and a drain region, the gate structure comprising a conductive gate electrode;

a counter-doped back-gate contact region positioned in the doped base semiconductor substrate, wherein the counter-doped back-gate region is doped with a second dopant type that is opposite the first type and wherein the counter-doped back-gate contact region is positioned at least partially vertically below the conductive gate electrode;

a conductive back-gate contact structure that is conductively coupled to an upper surface of the counter-doped back-gate contact region; and an isolation structure on the upper surface of the counter-doped back-gate contact region, wherein a lower surface of the isolation structure is substantially coplanar with a lower surface of the conductive back-gate contact structure.

14. The transistor of claim 13, wherein a conductive flow path is adapted to be formed in the doped base semiconductor substrate under at least a portion of the gate structure upon application of an appropriate voltage to one of the gate electrode, the source region or the drain region, wherein the conductive flow path is conductively coupled to the counter-doped back-gate contact region.

15. The transistor of claim 13, further comprising a counter-doped back-gate region positioned in the doped base semiconductor substrate.

16. The transistor of claim 15, wherein a conductive flow path is adapted to be formed in the doped base semiconductor substrate between the counter-doped back-gate contact region and the counter-doped back-gate region upon application of an appropriate voltage to one of the gate electrode, the source region or the drain region.

17. The transistor of claim 14, wherein the conductive flow path has a first dimension in the direction of the gate width of the transistor, wherein the first dimension is at least as great as the gate width of the transistor.

18. The transistor of claim 14, wherein the conductive flow path has a second dimension in the direction of the gate length of the transistor, wherein the second dimension is greater than the gate length of the transistor.

19. The transistor of claim 18, wherein the entirety of the conductive gate electrode is positioned vertically above the conductive flow path.

20. The transistor of claim 18, wherein only a portion of the conductive gate electrode is positioned vertically above the conductive flow path.

* * * * *